(12) United States Patent
Yang et al.

(10) Patent No.: US 9,337,036 B2
(45) Date of Patent: May 10, 2016

(54) METHOD OF FORMING COPPER SULFIDE FILM FOR REDUCING COPPER OXIDIZATION AND LOSS

(71) Applicant: Macronix International Co., Ltd., Hsinchu (TW)

(72) Inventors: Zusing Yang, Hsin-chu (TW); Hong-Ji Lee, Hsin-chu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 176 days.

(21) Appl. No.: 14/162,737

(22) Filed: Jan. 24, 2014

(65) Prior Publication Data

US 2015/0214054 A1    Jul. 30, 2015

(51) Int. Cl.
*H01L 21/00* (2006.01)
*H01L 21/16* (2006.01)
*H01L 21/02* (2006.01)
*H01L 21/027* (2006.01)

(52) U.S. Cl.
CPC .......... *H01L 21/165* (2013.01); *H01L 21/0234* (2013.01); *H01L 21/0273* (2013.01); *H01L 21/02568* (2013.01); *H01L 21/02614* (2013.01); *H01L 21/02639* (2013.01)

(58) Field of Classification Search
CPC .................. H01L 21/02557; H01L 21/0273; H01L 21/0234
USPC .............................................. 438/94
See application file for complete search history.

(56) References Cited

U.S. PATENT DOCUMENTS 5,953,628 A * 9/1999 Kawaguchi .................. 438/635
6,787,458 B1 * 9/2004 Tripsas et al. ................ 438/652

FOREIGN PATENT DOCUMENTS

JP            11312671 A   *  11/1999

* cited by examiner

*Primary Examiner* — Ajay K Arora
(74) *Attorney, Agent, or Firm* — Stout, Uxa & Buyan, LLP; Frank J. Uxa

(57) ABSTRACT

Effects of copper oxide formation in semiconductor manufacture are mitigated by etching with sulfide plasmas. The plasmas form protective copper sulfide films on copper surfaces and prevent copper oxide formation. When copper oxide formation does occur, the sulfide plasmas are able to transform the copper oxide into acceptable or more conductive copper compounds. Non-oxide copper compounds are removed using clear wet strips.

20 Claims, 4 Drawing Sheets

METHOD OF FORMING COPPER SULFIDE FILM FOR REDUCING COPPER OXIDIZATION AND LOSS

BACKGROUND OF THE INVENTION

1. Field of the Invention

The present invention relates generally to semiconductor device fabrication and, more particularly, to a method of mitigating effects of copper oxidation.

2. Description of Related Art

Copper is an attractive metal for use in integrated circuits because of its relatively low cost and relatively high conductivity. Its nearest competitor in the metal conductor category may be silver. While silver is a slightly better conductor than copper, its price is significantly higher. To appreciate the relationship, if the conductivity of copper is normalized to one (1.0), then the corresponding normalized conductivity of silver is about 1.06, about 6 percent higher (better) than that of copper. If the price of copper is normalized to one, however, then the normalized price of silver is about 120. For about the same conductivity, silver costs 120 times (two orders of magnitude) more. That is, using silver rather than copper in an integrated circuit trades a 6 percent improvement in conductivity for what may be about a $1.2 \times 10^4$ percent increase in material cost.

While presenting a substantial cost advantage, copper suffers from a significant disadvantage because of a tendency of copper to oxidize when exposed to air, thus forming a copper oxide coating on copper surfaces. Because copper oxide is nonconductive, methods of manufacturing integrated circuits that employ copper as a conductor necessarily must take steps to address the problem of oxidation of copper surfaces. Furthermore, a total amount of highly-conductive copper in a structure, such as a copper wire, layer or lead, is reduced from oxidation of a surface thereof, naturally, as a consequence of copper molecules of the surface being converted, e.g., into copper oxide, the reduced volume thus tending to detract from the total conducting capacity of the structure.

A need thus exists in the prior art for a method of preventing copper oxidation in integrated circuit fabrication. A further need exists for a method of mitigating effects of copper oxidation when it does occur.

SUMMARY OF THE INVENTION

The present invention addresses these needs by providing a method of semiconductor manufacture, comprising providing a substrate, depositing a first intermetal dielectric (IMD-1) layer on the substrate, and fabricating a copper (Cu) layer in the IMD-1 layer. A silicon nitride (SiN) layer is formed above the Cu layer and the IMD-1 layer, and a second intermetal dielectric (IMD-2) layer is deposited above the SiN layer, with an organic dielectric layer (ODL) overlying the IMD-2 layer and a silicon-containing hard mask bottom anti-reflecting coating (SHB) layer being disposed above the ODL.

A photoresist (PR) pattern is positioned over the SHB layer as a mask for etching the SHB, ODL, IMD-2 and SiN layers to form an opening that exposes at least a portion of an upper surface of the Cu layer. The PR pattern, SHB layer and ODL are removed, followed by the exposed portion of the Cu layer being contacted via, e.g., chemical vapor deposition and/or an etch, with a sulfide plasma to form a film of copper sulfide on the exposed upper surface of the Cu layer. The copper sulfide film may comprise cupric sulfide (CuS) and/or cuprous sulfide ($Cu_2S$). Formations of copper oxide (CuO and/or $Cu_2O$) on the exposed surface of the Cu layer, whether caused by inadvertence or design, can, according to an implementation of the invention, be contacted with the sulfide plasma. Etching the copper oxide, for example, with the sulfide plasma may transform the copper oxide into one or more of copper sulfate and copper sulfite.

While the apparatus and method has or will be described for the sake of grammatical fluidity with functional explanations, it is to be expressly understood that the claims, unless indicated otherwise, are not to be construed as limited in any way by the construction of "means" or "steps" limitations, but are to be accorded the full scope of the meaning and equivalents of the definition provided by the claims under the judicial doctrine of equivalents.

Any feature or combination of features described or referenced herein are included within the scope of the present invention provided that the features included in any such combination are not mutually inconsistent as will be apparent from the context, this specification, and the knowledge of one skilled in the art. In addition, any feature or combination of features described or referenced may be specifically excluded from any embodiment of the present invention. For purposes of summarizing the present invention, certain aspects, advantages and novel features of the present invention are described or referenced. Of course, it is to be understood that not necessarily all such aspects, advantages or features will be embodied in any particular implementation of the present invention. Additional advantages and aspects of the present invention are apparent in the following detailed description and claims that follow.

BRIEF DESCRIPTION OF THE FIGURES

FIG. 5 modifies the semiconductor stack of FIG. 4 with the addition of a metal fill-in;

DETAILED DESCRIPTION OF THE PRESENTLY PREFERRED EMBODIMENTS

Figure 1A:
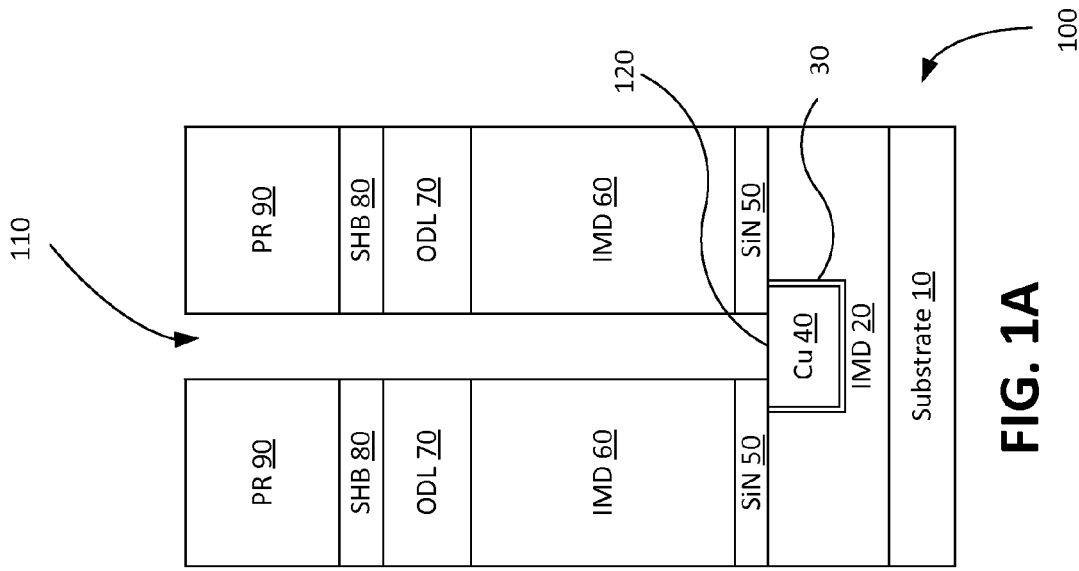
FIG. 1A illustrates formation of an opening in the semiconductor stack of FIG. 1 to expose a copper layer.

Embodiments of the invention are now described and illustrated in the accompanying drawings, instances of which are to be interpreted to be to scale in some implementations while in other implementations, for each instance, not. In certain aspects, use of like or the same reference designators in the drawings and description refers to the same, similar or analogous components and/or elements, while according to other implementations the same use should not. According to certain implementations, use of directional terms, such as, top, bottom, left, right, up, down, over, above, below, beneath, rear, and front, are to be construed literally, while in other implementations the same use should not. The present invention may be practiced in conjunction with various distributed data management and other techniques that are conventionally used in the art, and only so much of the commonly practiced process steps are included herein as are necessary to provide an understanding of the present invention. The present invention has applicability in the field of semiconductor manufacturing techniques and processes in general. For illustrative purposes, however, the following description pertains to a method of fabricating integrated circuit structures that employ copper and a related method of manufacture.

The present invention harnesses properties of known chemical reactions to remove unwanted formations of copper oxide (CuO and/or $Cu_2O$) which may be presented in semiconductor manufacturing processes that employ copper. Such chemical reactions can include:

$$Cu_2O + H_2S(g) \rightarrow Cu_2S + H_2O(g), \quad (Eq. 1)$$

where (g) denotes a gas

$$Cu + S_2 \rightarrow Cu_xS, \quad (Eq. 2)$$

where x=1 or 2

$$Cu + COS \rightarrow Cu_xS + CO, \quad (Eq. 3)$$

where x=1 or 2

Figure 1:
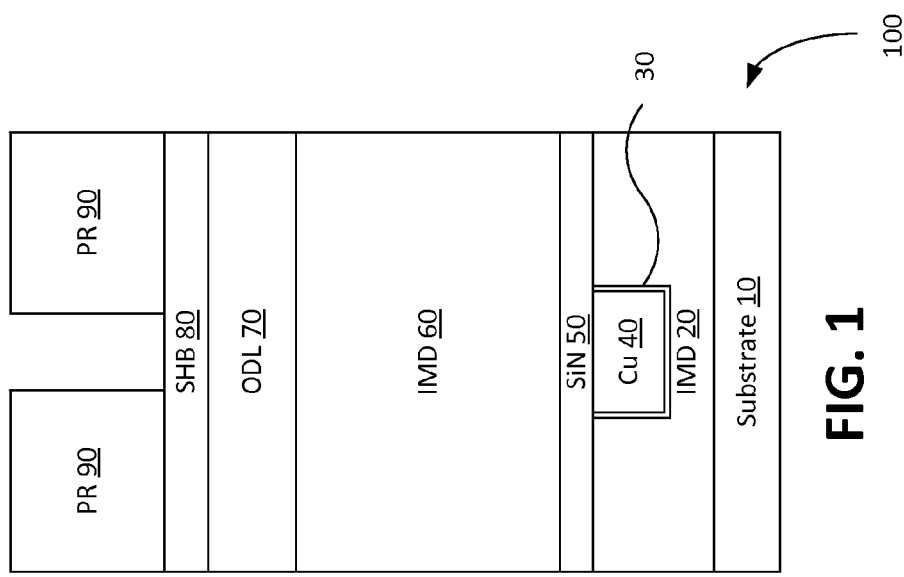
FIG. 1 is an illustration of a semiconductor stack formed according to the present invention.

Referring more particularly to the drawings, FIG. 1 is a reference diagram illustrating a semiconductor stack 100 formed on a substrate material 10 that may comprise, e.g., silicon. A first intermetal dielectric (IMD) layer 20, which may be formed of oxide film, such as tetraethyl orthosilicate (TEOS) and/or high-density plasma (HDP) materials, may be deposited on the substrate 10 using a thin film related manufacturing process to a thickness ranging from about 100 Å to about 5 kÅ. The first IMD layer 20 may have formed therein a trench 30 having a width/depth that may range from about 50 nm/2000 Å to about 200 nm/5000 Å with a typical value set being about 50 nm/5000 Å. A layer of copper (Cu) 40 may be formed inside the trench using, for instance, a damascene process as known in the art, including use of chemical mechanical polishing (CMP) to generate a flat upper surface of the Cu 40 and the first IMD layer 20. A thickness of the Cu 40 may range from about 100 Å to about 5000 Å with a typical value being about 3500 Å.

A silicon nitride (SiN) layer 50 may then be deposited by, e.g., a thin film manufacturing process to overlay the first IMD layer 20 and the Cu layer 40 with a thickness ranging from about 200 Å to about 500 Å, the thickness taking as an example a value of about 300 Å. Thereafter, a second IMD layer 60 may be provided to overlie the SiN layer 50, the second IMD layer 60 being deposited using, e.g., a thin film manufacturing process to a thickness that can be at a minimum about 1.5 kÅ or at a maximum about 10 kÅ, a typical thickness being about 6 kÅ.

The semiconductor stack at this stage can be topped with an insulator or dielectric material, an etch mask or hard-mask bottom anti-reflective coating (BARC), and a patterned layer or etch mask. With reference to the illustrated embodiment, this topping combination can comprise an organic dielectric layer (ODL) 70 overlying the second IMD layer 60, the ODL 70 being formed, for example, by use of a photoresist related manufacturing process to a thickness that ranges from about 2 kÅ to about 5 kÅ with a preferred value being about 3 kÅ, and a silicon-containing hard mask bottom anti-reflecting coating (SHB) layer 80 over the ODL 70, the SHB layer being deposited by use of a photoresist related manufacturing process to a thickness between about 200 Å and about 800 Å, such in a typical instance being about 600 Å.

As shown in FIG. 1, the etch mask may take the form of a photoresist (PR) layer 90 positioned over the SHB layer 80 to define a patterned mask for shaping the underlying semiconductor stack. An etch step(s) may be implemented to expose a portion of a surface of the Cu layer 40 as illustrated in FIG. 1A. The etch step, e.g., tri-layer, oxide and SiN etches, may be performed in part, apart, or in combination using known methods such as etching with $CF_4/C_4F_6/Ar/O_2$ etching gas to remove the SHB layer 80, etching with $O_2$ etching gas to remove the ODL 70, etching via $CF_4/Ar/O_2$ etching gas to remove a portion of the second IMD 60 layer and then etching with using $CF_4/Ar/N_2$ etching gas to remove a portion of the SiN layer 50 according to the PR pattern 90. The etch steps create an opening 110 in the semiconductor stack that extends down to and exposes at least a portion of a surface 120 of the Cu layer 40 as illustrated in FIG. 1A. The PR layer 90, remaining portions of the SHB layer 80 and remaining portions of the ODL 70 then may be removed using a known technique such as dry/wet strips.

Figure 1B:
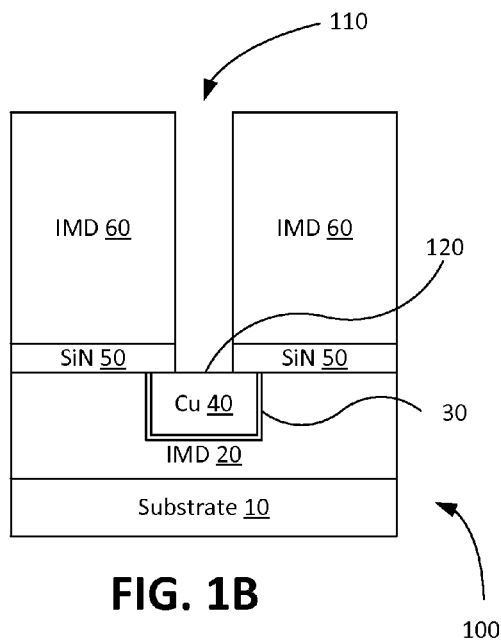
FIG. 1B shows an effect of removing upper layers of the semiconductor stack of FIG. 1A.

The resulting structure, as illustrated in FIG. 1B, points out the exposed nature and arrangement of surface 120 of the Cu layer 40. The semiconductor stack of FIG. 1B may then be contacted via, e.g., chemical vapor deposition and/or a plasma etch, with a plasma (which may embody or be referenced hereinbelow as a plasma etch or the like).

Figure 2:
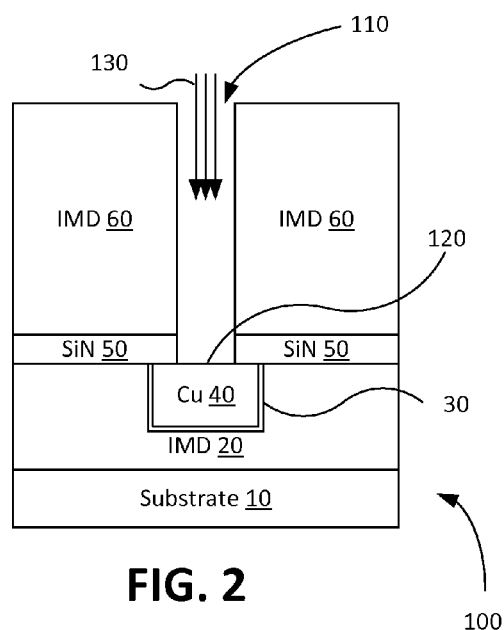
FIG. 2 graphically portrays contacting the exposed copper layer of FIG. 1B with a sulfide plasma.

As illustrated in FIG. 2, the plasma may be in the form of a sulfide plasma 130 comprising or consisting essentially of carbonyl sulfide (COS), hydrogen sulfide ($H_2S$), combinations thereof, and/or other sulfide sources. In any event, according to an aspect of the invention, the surface 120 of the Cu layer 40 may react with the plasma, e.g., plasma etchant, to provide or facilitate, for example, one or more of preservation of the underlying structure, enhanced bonding or interlayer connectivity, and maintaining of conductivity, when overlaid with metal, as compared to not performing the plasma etch.

The plasma etch may comprise or accompany chemical reactions, such as, for instance, in the case of the plasma comprising a sulfide plasma, those summarized in any one or more of Eq. 1, 2, and 3 above. Moreover, the contacting may readily facilitate fabrication of an alloy over, on, with, and/or in a neighborhood of the underlying structure.

Figure 3:
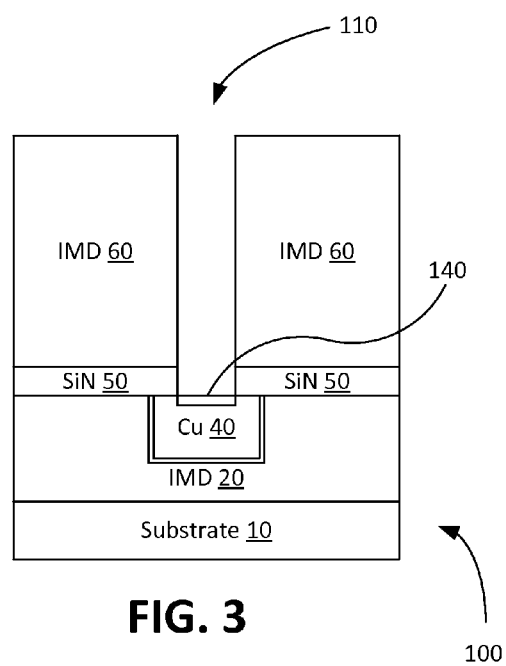
FIG. 3 illustrates formation of a copper sulfide film on the copper layer of FIG. 1B.

In the case of the plasma comprising a sulfide plasma, the surface 120 of the Cu layer 40 may react with the sulfide plasma to create a copper sulfide film 140 on the surface 120 of the Cu layer 40 as shown in FIG. 3. The copper sulfide film 140 may comprise amorphous or polycrystalline/single-crystalline material with unspecified crystal facets and/or may have a thickness ranging from about 1 nm to about 10 nm, with a preferred thickness of about 3 nm to about 5 nm. Moreover, the copper sulfide film 140 may comprise or constitute one or both of cupric sulfide (CuS) and cuprous sulfide ($Cu_2S$), referenced herein as $Cu_xS$. With regard to implementations in which the etching with sulfide plasma facilitates fabrication of an alloy, that alloy may include one or more of Cu—S—Ti, Cu—$Cu_xS$—Ti, and Cu—$Cu_xS$—TiN in a neighborhood of the surface 120 (FIG. 2).

According to a feature of the invention involving use of the copper sulfide film 140 to provide a protective function and/or quality to its underlying structure, in a particular instance of the illustrated example the forming of the copper sulfide film 140 prevents the formation of copper oxide on the surface 120 (FIG. 1B) of the Cu layer 40, as may result from exposure of the semiconductor stack 100 to an ambient fluid such as a gas and/or a vapor or atmosphere such as air. A cover of copper sulfide film 140 on the surface 120 also may prevent loss of copper material from the Cu layer 40.

Figure 4:
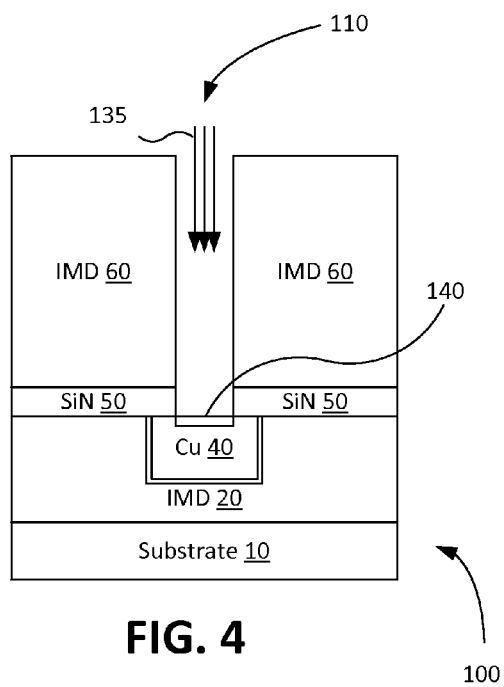
FIG. 4 depicts removing the copper sulfide film of FIG. 3 using wet strips.

When the presence of the copper sulfide film 140, or a threshold quantity or dimension thereof, cannot be tolerated for some reason (e.g., because of predetermined and/or highly stringent conduction requirements), then the copper sulfide film 140 may easily/readily be removed using clear wet strips 135 (FIG. 4) that may employ such materials as ammonium hydroxide ($NH_4OH$), nitric acid ($HNO_3$) and potassium cyanide (KCN). Relative to a traditional process employing organic acid, green (i.e., relatively environmentally friendly) or clear wet strips of $NH_4OH$ or $NH_4OH+H_2O+H_2O_2$ can be used.

Figure 6:
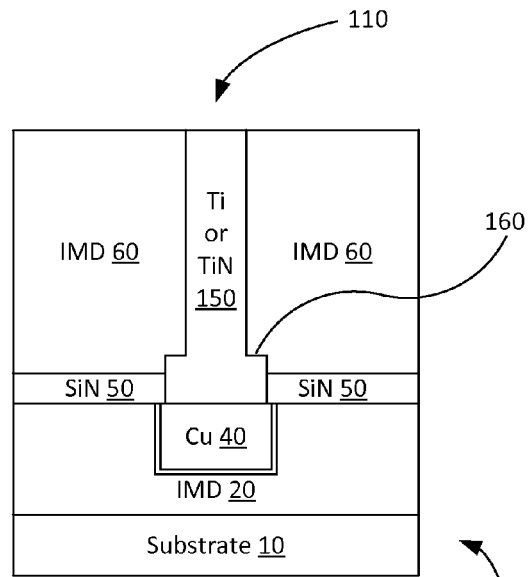
FIG. 6 schematically shows an undercut effect resulting from a conventional HF wet strip on the semiconductor stack of FIG. 4.

The methodology of using these materials can provide for clean removal of copper sulfide in contrast to prior-art approaches that may employ a traditional wet strip using hydrofluoric acid (HF), which is highly corrosive toward oxide-like film and yet has relatively little effect on organic or polymer-like residue. Those prior art methods can result in removal of additional material in the IMD 60 and the SiN 50 layers to form an undesirable undercut 160 as illustrated in FIG. 6 and/or may contribute to Cu loss, known to be a significant problem in Cu fabrication. According to an aspect of this disclosure, the use of green or clear wet strips as contemplated by the present disclosure, unlike methods of the prior art, may minimize a loss of copper material from the surface 120 (FIG. 1B) of the Cu layer 40. After removal of the copper sulfide film, the metal copper film 40 (FIG. 7) can be exposed or naked for a following process, e.g., metal fill-in.

Figure 5:
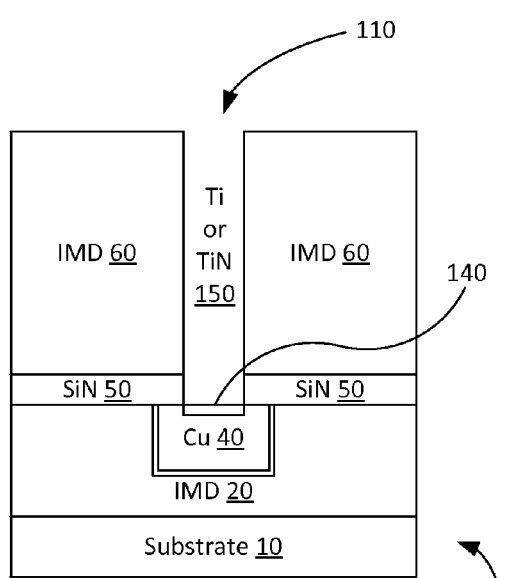

Whether or not the $Cu_xS$ film is removed, the opening 110 in the semiconductor stack 100 may then be filled, as shown in FIG. 5, with conducting material 150 such as one or more of titanium (Ti), titanium nitride (TiN) and combinations thereof. The filling may form a highly conductive path (e.g., connection) between an upper region (e.g., top surface) of the conducting material 150 and the Cu layer 40. That is, the copper sulfide film 140, being a relatively good conductor of electricity as compared to copper oxide, may introduce only a relatively small degradation in the conductance of the conductive path. Moreover, as a consequence of having performed a plasma etch, e.g. with sulfide plasma, the filling may form or accompany formation of an alloy, e.g., comprising one or more of Cu—S—Ti, Cu—CuS—Ti, Cu—$Cu_2$S—Ti, Cu—CuS—TiN and Cu—$Cu_2$S—TiN.

Figure 7:
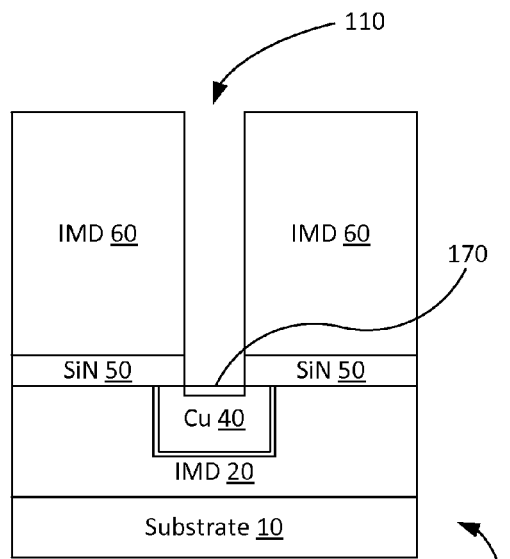
FIG. 7 illustrates the presence of an unwanted copper oxide film which, due to atmospheric exposure, may be formed on the surface of the copper layer of FIG. 1B.

In some embodiments of the present invention an oxide type of film, e.g., a copper oxide film 170 formed either inadvertently or by design, may be present on the exposed surface 120 of the Cu layer 40 as illustrated in FIG. 7. As discussed herein, such forming can have a detrimental effect on properties, e.g., electronic characteristics, of the copper according for example to a thickness of the copper oxide. In any event, when such presence is uninvited or unwanted, the copper oxide film 170 may be altered, attenuated or eliminated via one or both of removal and transformation into a film of another copper compound(s) such as $Cu_xS$ and/or compounds which may be referred to collectively as $Cu_xSO_y$ (e.g., $Cu_2SO_4$, $CuSO_4$, $CUSO_3$, $CU_2SO_3$), e.g. via etching the copper oxide film 170 with a sulfide plasma as already described. Formations of copper oxide on the exposed surface of the Cu layer 40 can accordingly be controlled by operation of contacting with the sulfide plasma. Etching the copper oxide, for example, with the sulfide plasma may transform the copper oxide into, for instance, the mentioned copper sulfide.

Figure 8:
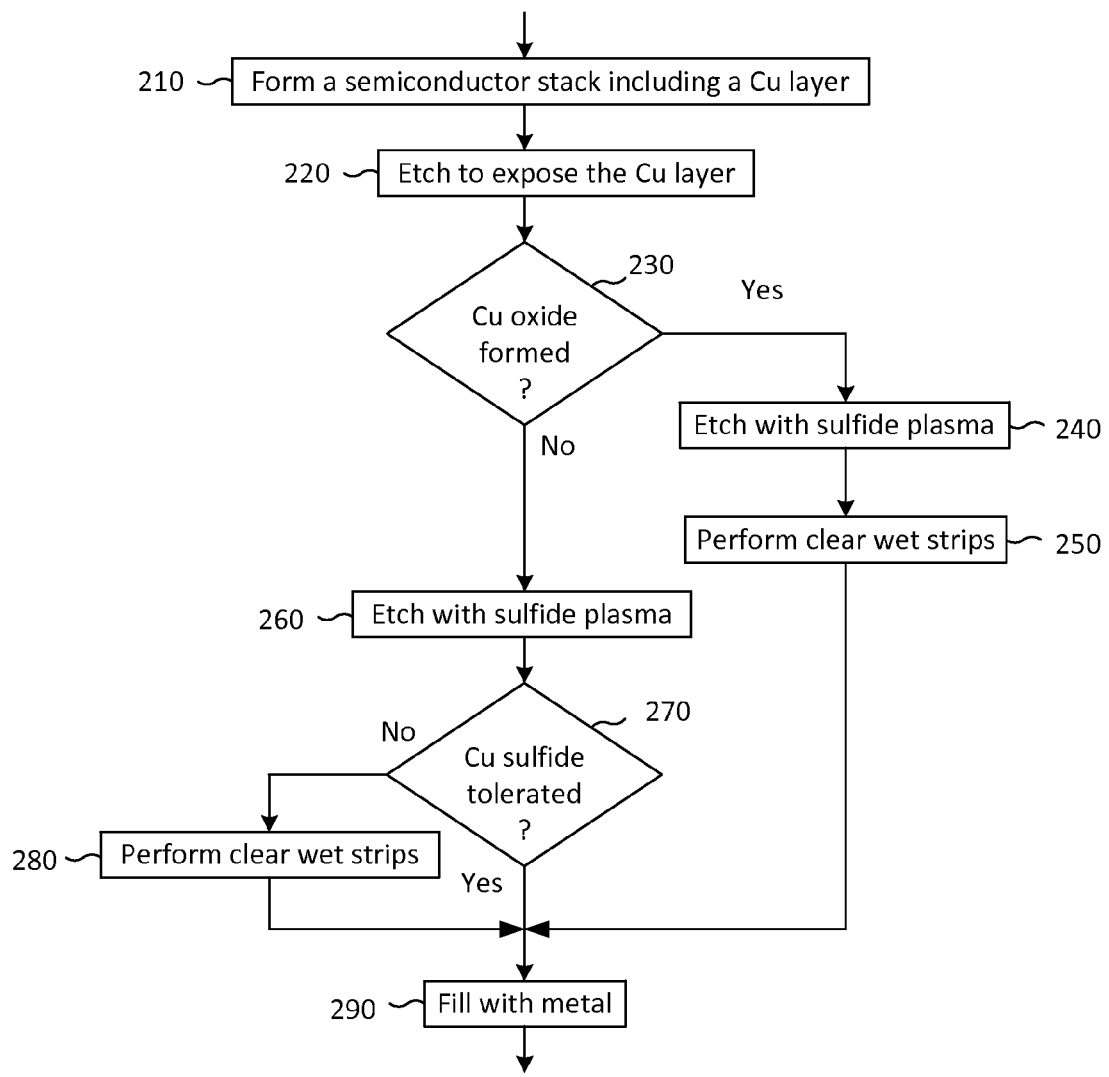
FIG. 8 is a flow chart of an implementation of a method of mitigating effects of copper oxide formation in semiconductor structures.

An implementation of the method of the present invention is summarized in the flow chart of FIG. 8, beginning with a step 210 of forming a semiconductor stack. The structure of FIG. 1 may be used as an exemplary context of the delineated action, in which the forming of a semiconductor stack 100 comprises providing a substrate 10, depositing a first IMD layer 20 on the substrate 10, creating a trench 30 in the first IMD layer 20 and fabricating a Cu layer 40 in the trench 30 using, e.g., a damascene process.

The implementation may continue by forming a SiN layer 50 above the Cu layer 40, forming a second IMD layer 60 to overlie the SiN layer 50, overlaying the second IMD layer 60 with an ODL 70, and depositing an SHB layer 80 above the ODL 70. A patterned PR layer 90 may be positioned on the SHB layer 80. At step 220 a sequence of etch operations may be executed to form an opening 110 (FIG. 1A) in the semiconductor stack 100 and to expose a surface 120 of the Cu layer 40. These etch operations remove portions of the SHB layer 80, the ODL 70, the second IMD layer 60, and the SiN layer 50, as already described. Step 220 may conclude with removing the PR layer 90 and remaining portions of the SHB layer 80 and the ODL 70 using methods known in the art.

A test may be performed at step 230 to determine whether $Cu_2O$, or an amount of $Cu_2O$ exceeding a predetermined threshold, has formed on the Cu layer 40. If unwanted $Cu_2O$ has formed, it may be transformed into a material such as $Cu_xS$ and/or $Cu_xSO_y$, by contacting and/or etching with a sulfide plasma at step 240 to form a copper sulfide film, followed by (optional) removing of the copper sulfide film at step 250 using, e.g., green or clear wet strip(s) as described. If no $Cu_2O$ has formed needing removal, then flow of the process may advance from the test at step 230 to step 260 entailing a contacting and/or etch operation using sulfide plasma to form a copper sulfide film on the surface 120 of the Cu layer 40 per that described above. The result of an ensuing test at step 270 may, when the presence of a copper sulfide film on the Cu layer 40 cannot be tolerated, require performing a wet strip, e.g., a green or clear wet strip process, via step 280 to remove some or all of the copper sulfide film. In other cases, the result of the test may conclude that the copper sulfide film or remnants thereof need not be removed. In either case, the implementation may continue as represented at step 290 by, for instance, filling the opening 110 with a suitable metal according to that elucidated in connection with the disclosed figures and preceding discussion.

Although the disclosure herein refers to certain illustrated embodiments, it is to be understood that these embodiments have been presented by way of example rather than limitation. For example, it will be understood by those skilled in the art that the invention described herein may find application in many Cu fabrication processes in the semiconductor industry, Cu fabrication process being used as a generic term for a semiconductor etch of interest. The intent accompanying this disclosure is to have the embodiments described herein construed in conjunction with the knowledge of one skilled in the art to cover all modifications, variations, combinations, permutations, omissions, substitutions, alternatives, and equivalents of the embodiments, to the extent not mutually exclusive, as may fall within the spirit and scope of the invention as limited only by the appended claims.

What is claimed is:

1. A method of semiconductor manufacture, comprising:
   providing a semiconductor stack on a substrate to include a first intermetal dielectric (IMD-1) layer, a copper (Cu) layer in the IMD-1 layer, a silicon nitride (SiN) layer, and a second intermetal dielectric (IMD-2) layer above the SiN layer;
   forming an opening that exposes at least a portion of an upper surface of the Cu layer;

contacting the exposed portion of the Cu layer with a sulfide plasma, thereby causing a film including copper sulfide to form on the upper surface of the Cu layer; and
forming a Ti-containing material in the opening.

2. The method as set forth in claim 1, in which the providing comprises, in sequence, depositing the IMD-1 layer on the substrate, fabricating the copper (Cu) layer in the IMD-1 layer, forming the SiN layer above the Cu layer and the IMD-1 layer, and depositing the IMD-2 layer above the SiN layer.

3. The method as set forth in claim 1, in which the providing further comprises overlaying the IMD-2 layer with an organic dielectric layer (ODL), disposing a silicon-containing hard mask bottom anti-reflecting coating (SHB) layer above the ODL, positioning a photoresist (PR) pattern on the SHB layer, and etching the SHB layer, the ODL, the IMD-2 layer, and the SiN layer according to the PR pattern to form the opening.

4. The method as set forth in claim 1, wherein copper oxide on the exposed portion of the Cu layer is etched with the sulfide plasma, the etching of the copper oxide with sulfide plasma transforming the copper oxide into one or more of cupric sulfide (CuS) and cuprous sulfide ($Cu_2S$).

5. The method as set forth in claim 1, wherein a thickness of the film ranges from about 1 nm to about 10 nm.

6. The method as set forth in claim 1, wherein the contacting with sulfide plasma comprises etching with one or more of carbonyl sulfide (COS) and hydrogen sulfide ($H_2S$).

7. The method as set forth in claim 1, wherein:
the providing comprises overlaying the IMD-2 layer with an organic dielectric layer (ODL), a silicon-containing hard mask bottom anti-reflecting coating (SHB) layer, and a photoresist (PR) pattern, and etching the SHB layer, the ODL, the IMD-2 layer, and the SiN layer according to the PR pattern to form the opening, followed by removing the PR pattern, the SHB layer, and the ODL; and
the forming of a film including copper sulfide to form on the upper surface of the Cu layer prevents oxidation of the upper surface of the Cu layer.

8. The method as set forth in claim 1, further comprising performing a wet strip operation to remove the film, whereby an undercut of the IMD-1 and SiN layers does not occur, and Cu loss is minimized as compared to a wet strip using hydrofluoric acid (HF).

9. The method as set forth in claim 8, wherein the performing comprises etching with one or more of $NH_4OH$, $HNO_3$, and KCN.

10. The method as set forth in claim 1, further comprising filling the opening with a metal to form a metal layer overlying the film, thereby providing a highly conductive connection between the metal layer and the Cu layer.

11. The method as set forth in claim 10, wherein the filling comprises filling with one or more of titanium (Ti) and titanium nitride (TiN).

12. The method as set forth in claim 11, wherein the filling comprises forming an alloy comprising one or more of Cu—S—Ti, Cu—CuS—Ti, Cu—$Cu_2S$—Ti, Cu—CuS—TiN, and Cu—$Cu_2S$—TiN.

13. A semiconductor device constructed according to the method of claim 10 in which the film is amorphous.

14. The method as set forth in claim 1, wherein the upper surface of the Cu layer comprises copper oxide, and the contacting of the exposed portion of the Cu layer with a sulfide plasma forms one or more of copper sulfite and copper sulfate on the upper surface of the Cu layer.

15. The method as set forth in claim 14, wherein the contacting of the exposed portion of the Cu layer with a sulfide plasma forms to at least one of CuS and $Cu_2S$.

16. The method as set forth in claim 14, further comprising removing the copper sulfide by operation of a wet strip.

17. The method as set forth in claim 16, wherein:
the removing uses a wet strip material comprising one or more of $HNO_3$, $NH_4OH$, and KCN; and
the method further comprises filling with a material containing Ti.

18. The method as set forth in claim 16, further comprising disposing a metal within the opening.

19. A semiconductor device fabricated according to the method of claim 18, wherein the disposing comprises filling with a material that includes Ti.

20. A semiconductor device manufactured according to the method of claim 14.

* * * * *